United States Patent
Kubena et al.

(10) Patent No.: US 11,567,147 B1
(45) Date of Patent: Jan. 31, 2023

(54) PHONONIC COMB ENHANCED GRADIOMETERS

(71) Applicant: HRL Laboratories, LLC, Malibu, CA (US)

(72) Inventors: Randall L. Kubena, Oak Park, CA (US); Walter S. Wall, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 315 days.

(21) Appl. No.: 16/932,431

(22) Filed: Jul. 17, 2020

Related U.S. Application Data

(60) Provisional application No. 62/881,069, filed on Jul. 31, 2019.

(51) Int. Cl.
| | |
|---|---|
| *G01R 33/022* | (2006.01) |
| *H01L 41/06* | (2006.01) |
| *H01L 41/04* | (2006.01) |

(52) U.S. Cl.
CPC ............ *G01R 33/022* (2013.01); *H01L 41/06* (2013.01); *H01L 41/042* (2013.01)

(58) Field of Classification Search
CPC .............. G01R 33/00; G01R 33/0035; G01R 33/0023; G01R 33/0017; G01R 31/3191; G01R 33/022; G01B 7/004; G01C 17/38; G06F 3/017; G06F 3/0346; G06F 3/012; H01L 41/06; H01L 41/042
See application file for complete search history.

(56) References Cited

U.S. PATENT DOCUMENTS

| | | | |
|---|---|---|---|
| 4,070,635 A | 1/1978 | Healey | |
| 4,132,964 A | 1/1979 | Wilcox | |
| 4,257,001 A | * 3/1981 | Partain | .................. G01N 22/00 |
| | | | 324/636 |

(Continued)

FOREIGN PATENT DOCUMENTS

| | | |
|---|---|---|
| KR | 10-2008-0044977 A | 5/2008 |
| KR | 10-2012-0132987 A | 12/2012 |

(Continued)

OTHER PUBLICATIONS

PCT International Preliminary Report on Patentability (Chapter I) with Written Opinion from PCT/US2020/051863 dated Apr. 7, 2022.

(Continued)

*Primary Examiner* — Jermele M Hollington
*Assistant Examiner* — Taqi R Nasir
(74) *Attorney, Agent, or Firm* — Ladas & Parry, LLP

(57) ABSTRACT

A differential gradiometer comprising a substrate with at least a pair of resonators disposed thereon, wherein each of the at least a pair of resonators is sensitive to environmental factors which produces differential strains between the resonators, a first one of said pair of resonators being connected with a circuit for forming a first oscillator, the second one of said pair of resonators being connected with another circuit for forming a non-linear oscillator, an output of the first oscillator being applied to the non-linear oscillator for generating a comb of frequencies, wherein an addition oscillator is locked to the nth tooth of the comb thereby increasing the sensitivity of the gradiometer by a factor of n.

25 Claims, 11 Drawing Sheets

(56) References Cited

U.S. PATENT DOCUMENTS

| | | | |
|---|---|---|---|
| 6,054,856 A * | 4/2000 | Garroway | G01R 33/343 600/407 |
| 6,433,543 B1 * | 8/2002 | Shahinpoor | G01R 33/0327 324/96 |
| 7,750,535 B2 | 7/2010 | Kubena | |
| 7,851,971 B2 | 12/2010 | Chang | |
| 8,601,607 B2 | 12/2013 | Hagman | |
| 8,765,615 B1 | 7/2014 | Chang | |
| 8,994,465 B1 | 3/2015 | Kubena | |
| 10,110,198 B1 | 10/2018 | Kubena | |
| 10,389,392 B1 | 8/2019 | Kubena | |
| 10,819,276 B1 | 10/2020 | Kubena | |
| 11,156,897 B2 | 10/2021 | Kubena | |
| 11,239,823 B1 | 2/2022 | Kubena | |
| 2010/0295546 A1 * | 11/2010 | Walther | G01R 33/028 257/E21.211 |
| 2010/0321117 A1 | 12/2010 | Gan | |
| 2012/0294319 A1 | 11/2012 | Maleki | |
| 2017/0047893 A1 | 2/2017 | Nguyen | |
| 2018/0157148 A1 | 6/2018 | Kim | |
| 2019/0250198 A1 | 8/2019 | Kubena | |
| 2020/0158769 A1 | 5/2020 | Liu | |

FOREIGN PATENT DOCUMENTS

| | | |
|---|---|---|
| WO | 2014-018444 A2 | 1/2014 |
| WO | 2019/217668 A1 | 11/2019 |

OTHER PUBLICATIONS

From U.S. Appl. No. 17/348,344 (unpublished, non-publication requested), Office Action dated Jan. 27, 2022.
From U.S. Appl. No. 16/932,455 (now published as U.S. Pat. No. 11,156,897), Notice of Allowance dated Jun. 23, 2021.
Haiti, et al., "Reducing oscillator PM noise from AM-PM noise correlation," Electronics letters 50.17 (2014): 1195-1197.
Howe, et al., "PM-AM correlation measurements and analysis,". May 2012, IEEE International Frequency Control Symposium Proceedings (pp. 1-5). IEEE.
"Phase Detector/Frequency Synthesizer: ADF4002 Data Sheet" Analog Devices 2006-2015, http://www.analog.com, pp. 1-20.
PCT International Search Report and Written Opinion from PCT/US2020/051863 dated Jan. 4, 2021.
U.S. Appl. No. 16/932,427, Kubena, filed Jul. 17, 2020.
U.S. Appl. No. 16/932,447, Kubena, filed Jul. 17, 2020.
U.S. Appl. No. 16/932,455, Kubena, filed Jul. 17, 2020.
U.S. Appl. No. 15/965,652, Kubena, filed Apr. 27, 2018.
U.S. Appl. No. 16/370,602, Kubena, filed Mar. 29, 2019.
U.S. Appl. No. 16/512,091, Sorenson, filed Jul. 15, 2019.
U.S. Appl. No. 16/775,242, Kubena, filed Jan. 28, 2020.
Askari, S. et al., "Near-Navigation Grade Quad Mass Gyroscope With Q-Factor Limited By Thermo-Elastic Damping," Solid-State, Actuators, and Microsystems Workshop Technical Digest, Hilton Head, South Carolina, USA, 2016, pp. 254-257.
Bennett, S. P. et al., "Magnetic Field Response of Doubly Clamped Magnetoelectric Microelectromechanical AlN—FeCo Resonators," Applied Physics Letters 111, 252903 (2017).
Bhatia, A. et al., "Linearization of Phase-Modulated Analog Optical Links using a Four-Wave Mixing Comb Source," Optics Express, DOI: 10.1364/OE 22.030899, Dec. 4, 2014.
Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A., et al., "Phononic Frequency Combs For Engineering MEMS/NEMS Devices With Tunable Sensitivity," 2019 IEEE (4 pages).
Ganesan, A. et al., "Phononic Frequency Comb via Intrinsic Three-Way Mixing," Physical Review Letters, PRL 118, 033903 (2017), (5 pages).
Hui, Y. et al., High Resolution Magnetometer Based on a High Frequency Magnetoelectric MEMS-CMOS Oscillator, Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003).
Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.
Kubena, et al., "A Fully Integrated Quartz MEMS VHF TCXO," 2017 IEEE Frequency Contol Symposium, Besancon, Fr., pp. 68-71, Jul. 2017.
Kubena, R. L., et al. "Phononic Comb Generation in High-Q Quartz Resonators", Applied Physics Letters, 116, 053501 (2020).
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Sheng, et al., "A Microfabricated Optically-Pumped Magnetic Gradiometer," Applied Physics Letters 110, 031106 (2017).
Veryaskin, A. "Gravity, Magnetic and Electromagnetic Gradiometry: Strategic Technologies in the 21st century", IOP ebooks, 2018 (57 pages).
Vrba, J., "SQUID Sensors: Fundamentals, Fabrication and Applications," edited by H. Weinstock, Kluwer Academic, Dordrecht, The Netherlands, 1996, p. 117.
Wang, S. et al., "A MEMS Resonant Accelerometer for Low-Frequency Vibration Detection," Sensors and Actuators A: Physical, 283, Nov. 2018, pp. 151-158.
WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.
Yao, et al., "Bulk Acoustic Wave-Mediated Multiferroic Antennas: Architecture and Performance Bound," IEEE Transactions on Antennas and Propagation, vol. 63, No. 8, Aug. 2015.
Zhai, J.., et. al., "Detection of Pico-Tesla Magnetic Fields using Magneto-Electric Sensors at Room Temperature," Applied Physics Letters, 88, 062510 (2006).
From U.S. Appl. No. 16/932,455 (now published as US 2021-0091748), office action dated Apr. 22, 2021.

* cited by examiner

PHONONIC COMB ENHANCED GRADIOMETERS

CROSS REFERENCE TO RELATED APPLICATIONS

This application claims the benefit of U.S. Provisional Patent Application Ser. No. 62/881,069 filed 31 Jul. 2019 and entitled "Phononic Comb Enhanced Gradiometers", the disclosure of which is hereby incorporated herein by reference.

This application is related to the technology disclosed in U.S. Provisional Patent Application Ser. No. 62/881,063 filed 31 Jul. 2019 and entitled "Magnetostrictive MEMS Magnetic Gradiometer" and its corresponding U.S. Non-Provisional patent application Ser. No. 16/932,427 filed on the same date as this application and also entitled "Magnetostrictive MEMS Magnetic Gradiometer", the disclosures of which are hereby incorporated herein by reference.

This application is also related to the technology disclosed in U.S. Provisional Patent Application Ser. No. 62/521,174, filed Jun. 16, 2017 and entitled "A Quartz MEMS Piezoelectric Resonator for Chipscale RF Antenna" and its related U.S. Non-Provisional patent application Ser. No. 15/965,652, filed Apr. 27, 2018 with the same title as the provisional application, the disclosures of which are hereby incorporated herein by reference.

This application is also related to the technology disclosed in U.S. Provisional Patent Application Ser. No. 62/678,897, filed 31 May 2018 and entitled "Broadband Integrated RF Magnetic Antenna", and its related U.S. Non-Provisional patent application Ser. No. 16/370,602 filed 29 Mar. 2019 with the same title as the provisional application, the disclosures of which are hereby incorporated herein by reference.

This application is also related to the technology disclosed in U.S. patent application Ser. No. 15/965,652, filed 27 Apr. 2018 and entitled "A Quartz MEMS Piezoelectric Resonator for Chipscale RF Antennae" and to its Provisional Application Ser. No. 62/521,174 filed Jun. 16, 2017. This application is also related to U.S. patent application Ser. No. 16/269,847, filed 7 Feb. 2019 and entitled "A Dual Magnetic and Electric Field Sensor" and to its Provisional Patent Application Ser. No. 62/628,612 filed 9 Feb. 2018. The disclosures of each of the aforementioned U.S. patent applications are hereby incorporated herein by reference.

This application is also related to the technology disclosed in U.S. patent application Ser. No. 16/775,242, filed 28 Jan. 2020 and entitled "A femto-Tesla MEMS RF Antenna with Integrated Flux Concentrator" and to its related Provisional Patent Application Ser. 62/826,757, filed on 29 Mar. 2019, the disclosures of which are hereby incorporated herein by reference.

This application is also related to the technology disclosed in U.S. Provisional Patent Application Ser. No. 62/904,052 filed 23 Sep. 2019 and entitled: "Enhanced Stability Oscillators using a Phononic Comb" and its related U.S. Non-Provisional patent application Ser. No. 16/932,455 filed on the same day as this application and with the same title as the related provisional application, the disclosures of which are hereby incorporated herein by reference.

This application is also related to the technology disclosed in U.S. Provisional Patent Application Ser. No. 62/890,799 filed 23 Aug. 2019 and entitled: "Phononic Comb Enhanced Gravity Gradiometer" and its related U.S. Non-Provisional patent application Ser. No. 16/932,447 filed on the same day as this application and with the same title as the related provisional application, the disclosures of which are hereby incorporated herein by reference.

STATEMENT REGARDING FEDERALLY SPONSORED RESEARCH OR DEVELOPMENT

None

TECHNICAL FIELD

Sensing devices and technologies and more particularly magnetic gradiometers with enhanced detection capabilities.

BACKGROUND

Resonant mode sensors/gradiometers operate by detecting a relative frequency shift between a pair of resonators. For mechanical sensors, this relative frequency shift is usually produced by a change in the differential strain on the resonators from an external influence. Typically, this relative frequency is detected by either an analog or digital phase lock loop (PLL). The sensitivity is determined by the size of the frequency shift compared to the stability of resonators/oscillators. The stability is affected by temperature drifts at low frequency and electronic noise in the sustaining circuits at higher frequencies. If the magnitude of the frequency shift can be amplified in some manner, the signal-to-noise ratio (SNR) of the sensor/gradiometer can be enhanced. This disclosure presents a method for enhancing the frequency shifts to enhance the SNR by using phononic frequency combs.

Magnetostrictively-driven piezoelectric resonators offer the possibility of sensing magnetic RF fields with high sensitivity with extreme sub-wavelength ($<<\lambda$) structures and at room temperature. See T. Nan, et. al., "Acoustically Actuated Ultra-Compact NEMS Magnetoelectric Antenna," *Nature Communications*, 8:296, DOI: 10.1038/s41467-017-00343-8 (2017) and J. Zhai, et. al., "Detection of Pico-Tesla Magnetic Fields using Magneto-Electric Sensors at Room Temperature," *Applied Physics Letters*, 88, 062510 (2006), the disclosures of which is hereby incorporated herein by reference.

The sensitivity can be enhanced by the high mechanical gain (Q) of the resonator, thereby amplifying the piezoelectric voltage produced by the resonator. In addition, the magnetic layer can introduce a modulated strain in the piezoelectric resonator which can shift the oscillator frequency if the resonator is used with a feedback sustaining circuit. This frequency or phase shift can then be used as a measurement of the amplitude of the incident magnetic field. Both sensor designs can be implemented in a wafer-level (yielding ultra-thin antennas) process with high-Q quartz resonators using the HRL QMEMS process. See the related patent applications identified above.

Currently, there is a desire for these devices to achieve noise floors similar to quantum-based SQUID devices (~1 fT $\sqrt{Hz}$ in a shielded environment) which require cryogenic cooling to 4.2K (See J. Vrba, *SQUID Sensors: Fundamentals, Fabrication and Applications*, edited by H. Weinstock Kluwer Academic, Dordrecht, The Netherlands, 1996 p. 117) or SERF (spin exchange relaxation-free) atomic magnetometers (see Kominis, I. K., Kornack, T. W., Allred, J. C. & Romalis, M. V. "A subfemtotesla multichannel atomic magnetometer," *Nature* 422, 596-599 (2003)). However, even by incorporating high-Q resonators with high permeability ($\mu_r$>1000) magnetic films, the predicted sensitivities for many SoA magnetostrictively-driven resonators is only near 100 fT/√Hz to 1 pT/√Hz.

In order to achieve SQUID-like performance with small MEMS-based resonators, an additional gain in sensitivity of roughly two order of magnitude is needed. We recently disclosed a method of increasing the sensitivity for small MEMS resonators using flux concentrators. See U.S. Provisional Patent Application Ser. No. 62/826,757 filed 29 Mar. 2019 referenced above.

However, for certain magnetostrictive layers, increasing the magnetic flux can interfere with the built-in magnetic bias when exposed to the earth's magnetic field. When used with a phase detection method, the ability to increase the phase shift for a given magnetic field while not interfering with the optimized built-in bias point is desirable.

In this disclosure we present a method for increasing the magnetic sensitivity using nonlinear effects to amplify the phase separation between two oscillators incorporating magnetostrictively-coated resonators without the need to amplify the local magnetic field at the sensor. This technique provides for enhanced sensitivity and measurement accuracy in ambient earth environments. The technique can also be applied to other gradient sensors (gradiometers) which use relative frequency shifts as the measure of the gradient amplitude of a physical parameter. Examples, are pressure or gravity gradiometers. The disclosed technique of generating a comb using a pair of resonators to enhance detection of physical parameters may well have a wide application for differential field measurements.

As mentioned above, this disclosure addresses a method to produce MEMS-based gradiometers with high sensitivity. U.S. Provisional Patent Application Ser. No. 62/881,063 filed 31 Jul. 2019 and entitled "Magnetostrictive MEMS Magnetic Gradiometer" and its corresponding U.S. Non-Provisional patent application Ser. No. 16/932,427 filed on the same date as this application and also entitled "Magnetostrictive MEMS Magnetic Gradiometer" teaches a MEMS based magnetic gradiometer using magnetostrictive material on its MEMS resonators. This disclosure relates to an improvement over that disclosed by the just mentioned U.S. Patent Application in that a new method and apparatus is proposed to increase the sensitivity of the differential magnetic field measurement. In order to obtain SoA RF magnetic sensitivity with small and low power sensors, current MEMS-based magnetostrictive magnetic field sensor need to improve their sensitivities by several orders of magnitude. There are various approaches to obtain that improvement. For on-resonant antennas that produce a voltage out for a given input magnetic field, several antennas can be arrayed in series to increase the voltage output. Alternatively, built-in vertical magnetic moments are predicted to strongly increase the coupling to shear-mode resonators. However, when used to detect a frequency shift for wide bandwidth applications, other methods are required. One could increase the stress applied to the resonator for a given magnetic field using alternate resonator designs or one can increase the local magnetic field that the resonator sees. However, if the optimal bias point for a magnetostrictive layer is below about 100 Oe, then increasing the local earth's magnetic field (about 0.5 Oe) by a factor of 100× can result in modifying the pre-set bias conditions and thus reducing the AC sensitivity.

BRIEF DESCRIPTION OF THE INVENTION

This disclosure describes an alternate technique based on exciting phononic frequency combs for improving the sensitivity of any gradiometer detector based on measuring relative frequency shifts of pairs of mechanical resonators. See also A. Ganesan and A Seshia, "Evidence for Simultaneous Growth and Saturation Mechanisms in Phononic Frequency Combs," *IEEE*, 2019 *Frequency Control Symposium*, Orlando, Fla., Apr. 14-18, 2019 and R. L. Kubena, et al. "Phononic Comb Generation in High-Q Quartz Resonators", Applied Physics Letters, 116, 053501 (2020), the disclosures of which are hereby incorporated herein by reference. By applying a large signal close to a resonant frequency of a resonator, a coherent frequency comb can be generated through nonlinear mixing effects with various modes of the resonator. The frequency comb has equally spaced resonances with the spacing equal to the difference between drive frequency and an internal mode of the resonator. Using these equally spaced frequencies as a metrology index with a VCXO and a phase detector and a correlator, one can effectively multiply the phase or frequency difference by the mode number of the comb (or higher) and obtain a reduction in the phase error which is traditionally limited by the linewidth (Q) of each oscillator output. Recently, we have found that the teeth signals in the generated frequency comb in quartz resonators can be generated with similar linewidths as the oscillator drive signal (see FIGS. 5 and 6). Thus, very little additional phase noise appears to be generated by the nonlinear processes that produce the comb.

For magnetic sensing, this method can both increase sensitivity and allow for native earth terrain measurements with a wide variety of magnetostrictive layers. Hence, magnetic anomaly detection would be possible with sub-pT/√Hz sensitivity with a small uncooled, low power sensor.

The presently disclosed technology provides a method of improving or enhancing an environmental factor (such as a magnetic field, a field of temperatures, a variation in gravity, etc), the environmental factor being sensed with the aid of a first resonator configured with a sustaining circuit as an oscillator, applying an output of the first resonator to a second resonator configured as a non-linear resonator for generating a comb of frequencies, the frequencies in said comb of frequencies being each separated by a frequency that corresponds to a difference in said environmental factor as sensed at the first and second resonators, and applying an output of the non linear resonator to a mixer, phase detector and a third and optionally a fourth resonator configured as oscillators for selecting a $n^{th}$ tooth in said comb of frequencies for detecting an enhanced version of said difference in said environmental factor as sensed at the first and second resonators. The optional fourth resonator is desirable since a common mode signal will shift both the drive frequency and mode frequency in the non-linear resonator, the fourth resonator can be advantageously used to subtract the common mode signal from the comb teeth difference frequency. In many cases, depending on the comb structure, the enhancement will be at, close, or higher than n times the frequency difference sensed at the first and second resonators. The mode driven in the nonlinear resonator is picked so that a nonlinear mixing process can occur in the resonator which produces a comb. An example of the modes present in a quartz resonator, and the mode which can produce a comb, is shown in FIG. 5. Several of these modes have been shown to generate frequency combs including both the main shear mode and several of the spurious modes depending on various factors such as the Q of the mode and the drive level.

More specifically, for magnetic sensing, the presently disclosed technology provides a differential magnetic field sensor comprising a substrate with at least a pair of resonators disposed thereon, wherein each of the at least a pair of resonators is at least partially covered or coated with a magnetostrictive film, a first one of said pair of resonators being connected with a circuit for forming a Voltage Controlled Crystal Oscillator (VCXO), the second one of said pair of resonators forming a Non Linear Crystal Oscillator (NLXO), an output of the VCXO being applied to the NLXO for generating a comb of frequencies, wherein a difference between adjacent teeth in the comb of frequencies corresponding a difference in the magnetic fields sensed by the at least a pair of resonators of the VCXO and the NLXO.

The preferred embodiments utilize resonators with quartz vibrating members and hence there are often references 'crystal' or 'quartz' resonators or 'crystal' sustaining circuits herein. It should be noted that other materials may be used instead of quartz, including non-crystalline materials, so this technology is not limited to the use of 'crystal' or 'quartz' resonators. Additionally, the resonators are preferably mounted on a semiconductor substrate such as silicon; however, it should be understood that the substrate could be a non-semiconductor material (such as a printed circuit board) or could be a semiconductor material other than silicon, such as various III-V materials known by those skilled the art.

DETAILED DESCRIPTION

Figure 1:
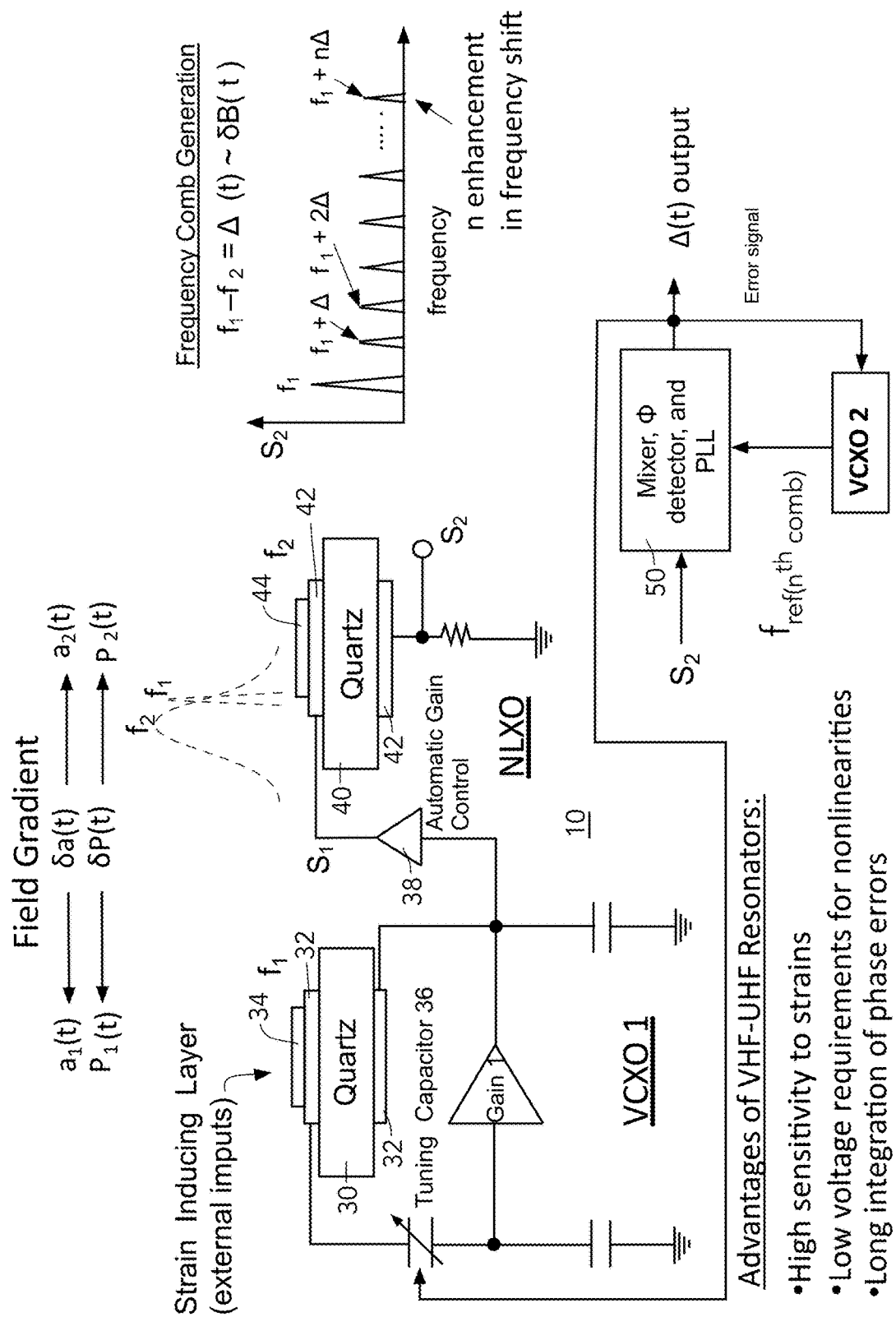
FIG. 1 is a drawing depicting an first embodiment of circuitry for using a phononic comb for enhancing the sensitivity of a preferably MEMS-based, field gradiometer. The field gradient could be, for example, a pressure, acceleration, temperature, or magnetic field gradient which produces a strain gradient between the resonators thereby inducing a frequency shift between the resonators which is enhanced by the phononic comb of the disclosed circuitry.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Multiple embodiments are described in the following paragraphs, but it will be apparent to the reader that element numbering used with respect to each of embodiment is maintained over the multiple embodiments where the elements are either basically the same or similar in function, for ease of explanation.

Fabrication processes for quartz MEMS devices have been described in previous U.S. Pat. Nos. 7,750,535; 7,851,971; and 8,765,615, and in U.S. patent application Ser. No. 14/973,701 filed Dec. 17, 2015 and in U.S. Provisional Patent Application Ser. No. 62/417,111 filed on Nov. 3, 2016, the disclosures of which are hereby incorporated herein by reference. These patents and patent applications describe starting with a quartz resonator wafer and depositing top-side electrode metal and the interconnect metal for running to the bond pads. However, in the new process disclosed herein any physical mechanism such as proof masses or magnetostrictive materials (such as film of FeGa, FeGaB or FeCoB) which are deposited or otherwise connected to the resonators and which induce a change in the differential frequencies of the resonators are envisioned. If a magnetostrictive film is suitably conductive, then it can also serve as a metallic electrode so in that case a separate metallic electrode can be omitted. Additionally, the magnetostrictive film can be applied to either one side of the quartz resonator or both sides thereof. The metallic electrodes, if used, are omitted in many of the figures, since their use can be optional in some embodiments and, if used, their presence can assumed by the reader. Only FIGS. 1 and 3 explicitly show the metallic electrodes 32 and 42.

Figure 2:
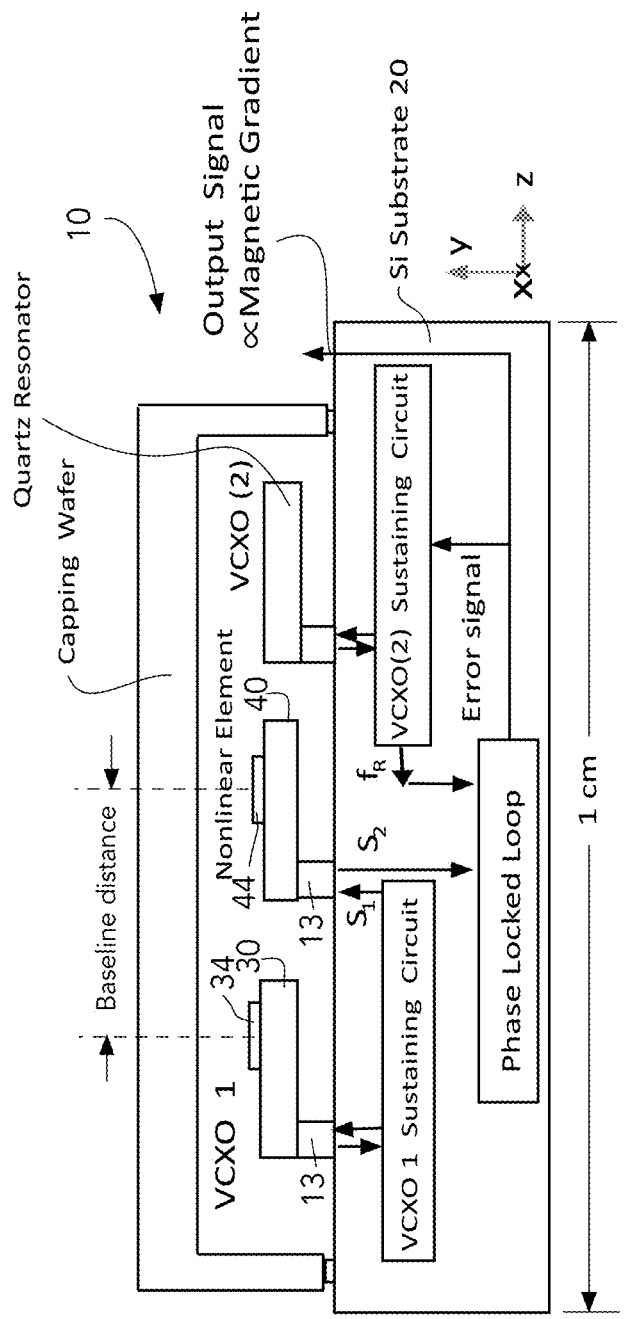
FIG. 2 depicts the resonators of the first embodiment of FIG. 1 disposed on a common semiconductor substrate the substrate preferably embodying the other electronic devices of FIG. 1, the metallic electrodes being omitted from the resonators for clarity of representation.
Figure 3:
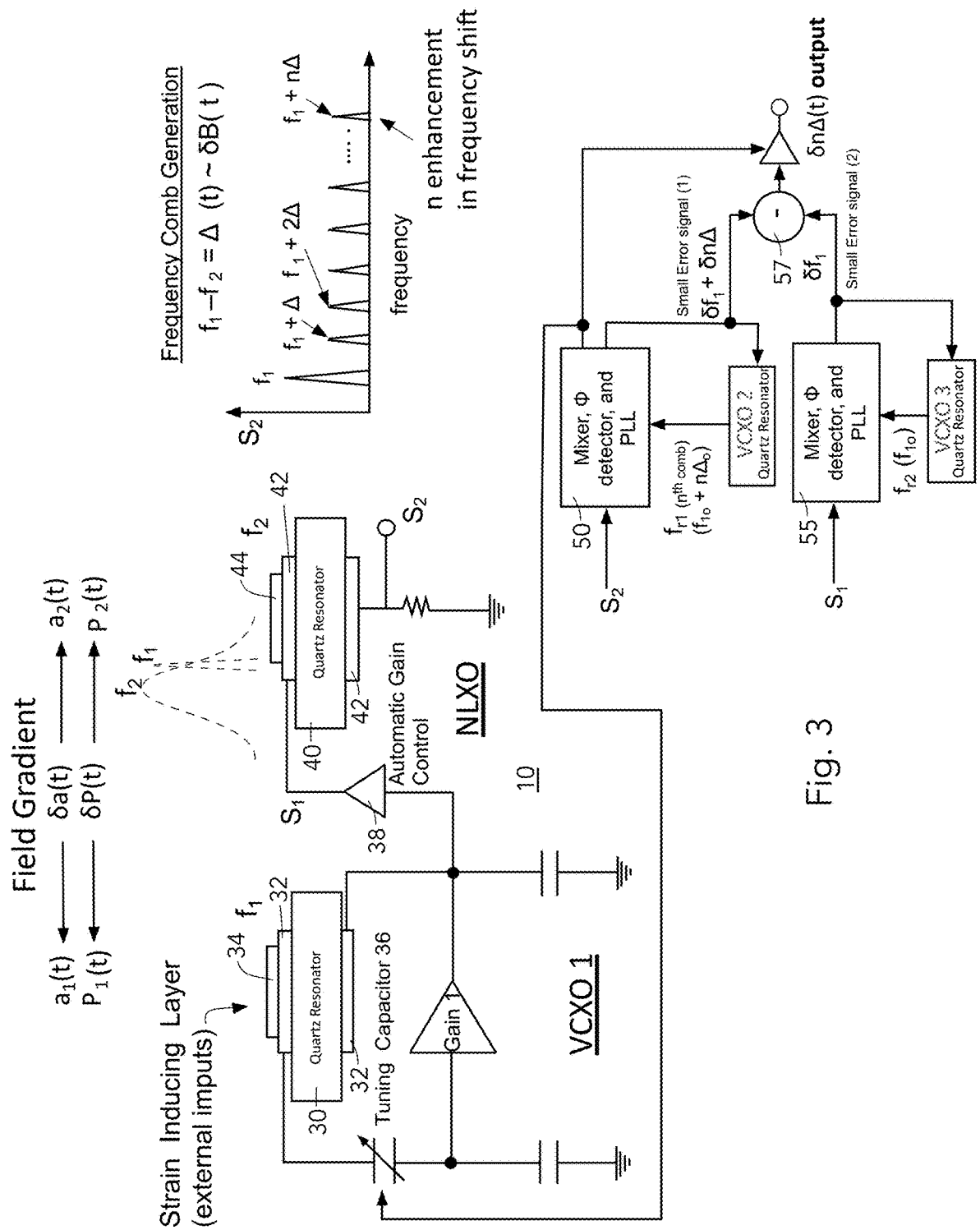
FIG. 3 is a drawing depicting a second embodiment of circuitry for using a phononic comb for enhancing the sensitivity of a preferably MEMS-based, field gradiometer. The field gradient could be, for example, a pressure, acceleration, temperature, or magnetic field gradient which produces a strain gradient between the resonators thereby inducing a frequency shift between the resonators which is enhanced by the phononic comb.
Figure 4:
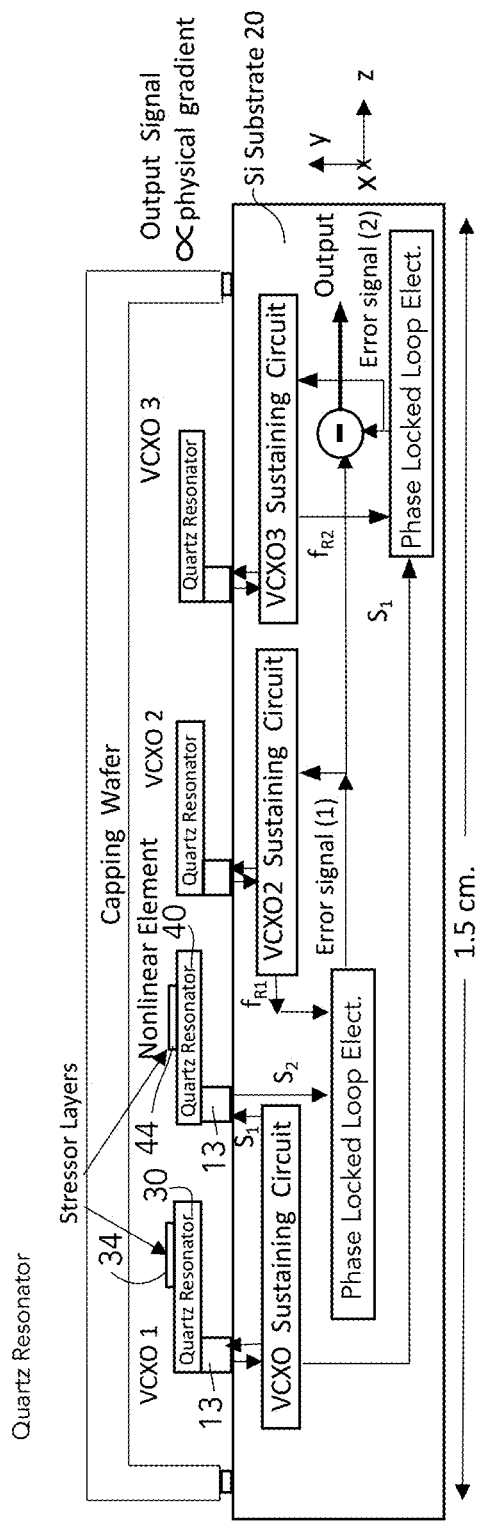
FIG. 4 depicts the resonators of the second embodiment of FIG. 3 disposed on a common semiconductor substrate the substrate preferably embodying the other electronic devices of FIG. 3, the metallic electrodes being omitted from the resonators for clarity of representation.

Two embodiments of circuitry which utilize this phononic comb approach for improving the sensitivity of a gradiometer 10 are shown in FIGS. 1 and 3. The circuits of FIGS. 1 and 3 can be disposed on a common semiconductor substrate 20 (such as silicon) is depicted by FIGS. 2 and 4, which correspond respectively to the embodiments of FIGS. 1 and 3. The second embodiment of FIGS. 3 and 4 is similar to the first embodiment of FIGS. 1 and 2, but the second embodiment differs from the first embodiment by the addition of an additional resonator VCXO 3 and an additional PLL 55. Since the two embodiments are otherwise very similar, common reference numbers are used herein to refer to elements or components which perform the same or nearly the same functions in these two embodiments.

A first tuned crystal oscillator VCXO 1 is preferably embodied by an AT-cut quartz resonator 30 having two preferably metallic electrodes 32, at least one of which is coated with or connected to a strain inducing layer or structure 34. This resonator is preferably attached to substrate 20 by bond pads 13, which crystal oscillator is controlled by a Voltage Controlled Crystal Oscillator (VCXO 1) sustaining circuit to produce a sharp resonance at a frequency $f_1$. During calibration preferably without an external stimulus present, the center frequency of the VCXO 1 is tuned to be not quite equal to a resonant mode frequency, preferably $f_2$, (see FIG. 7) of the second resonator 40 in a non-linear crystal oscillator circuit NLXO. The second quartz resonator 40 preferably has two preferably metallic electrodes 42, at least one of which is coated or connected to a strain inducing layer or structure 44 and is also preferably attached to substrate 20 by its own bond pads 13. Preferably, each resonator 30, 40 has a strain inducing layer or structure 34, 44 connected thereto. The output of the VCXO 1 is applied to the second resonator 40 of the non-linear crystal oscillator circuit NLXO preferably via an Automatic Gain Control (AGC) amplifier 38. The frequency difference ($f_1-f_2=\Delta$) is modulated by the sensed physical gradient (for example, a differential magnetic field $\delta B(t)$, or acceleration $\delta a(t)$, tor some other environmental factor or field of to be sensed) between the two resonators 30, 40. The gain in the sustaining circuit provided by amplifier Gain 1 of the VCXO 1 is optimized based on the first resonator's motional resistance, $R_1$, and preferably for obtaining an optimized phase noise. The output of VCXO 1 is applied to a drive electrode 42 of the second resonator in the non-linear crystal oscillator circuit NLXO and the level of the signal is determined by the gain of the AGC (Automatic Gain Control) amplifier 38. The level of the input signal to the second resonator 40 is adjusted to produce a nonlinear response in the quartz material of the resonator as evidenced by the generation of a frequency comb at $f_1$, $f_1 \pm \Delta$, $f_1 \pm 2\Delta$, $f_1 \pm 3\Delta$ ... $f_1 \pm nA$. The frequency of the Voltage Controlled Crystal Oscillator VCXO1 sustaining circuit associated with the first resonator 30 resulting in the frequency comb is adjusted to be offset (by A) from a mode within the nonlinear element provided by the second resonator 40. This mode may be a non-shear, flexural or twisting mode as is explained with reference to FIG. 7, but it should be understood that it is also possible to utilize the shear mode of the second resonator 40 should that be desired. The $\Delta$ offset determines the separation between the comb teeth. The comb can have >10 teeth both above and below the center frequency $f_1$ of the first resonator 30. So the comb appears at $f_1$, $f_1+A$, $f_1+2\Delta$, $f_1+3\Delta$ ... $f_1+n\Delta$ and also at $f_1-\Delta$, $f_1-2\Delta$, $f_1-3\Delta$ ... $f_1-n\Delta$ as is depicted for one particular embodiment in FIG. 5. For ease of illustration, only the higher frequency teeth are specifically shown in FIGS. 1 and 3, it being understood that the comb typically appears on both sides of the center frequency $f_1$. A range adjust signal may be sent to the tuning capacitor (which may be embodied as varactor diode) 36 (located within the first VCXO 1 circuit) to adjust the comb settings to maintain a large dynamic range, in which case the voltage applied to the tuning capacitor 36 would be stepped to provide a larger dynamic range than the comb itself can provide without a scale factor adjustment.

Turning again to FIGS. 1 and 3, any physical parameter that induces frequency shift between the resonators 30 and 40 can be measured. Resonators form the basis of many physical detectors such as those for measuring pressure gradients, temperature gradients, acceleration gradients etc. Any mechanism that can be implemented to create relative strain differences between the two resonators (via the strain inducing layers 34 and 44) which, in turn, produces relative frequency shifts that can be improved by increasing the frequency shifts seen in a phase lock loop as described herein. Utilizing a magnetostrictive material for strain inducing layer or structure 34, 44 allows these embodiments to function as a gradiometer that is sensitive to a differential magnetic field sensed between the two resonators 30 and 40.

Figure 5:
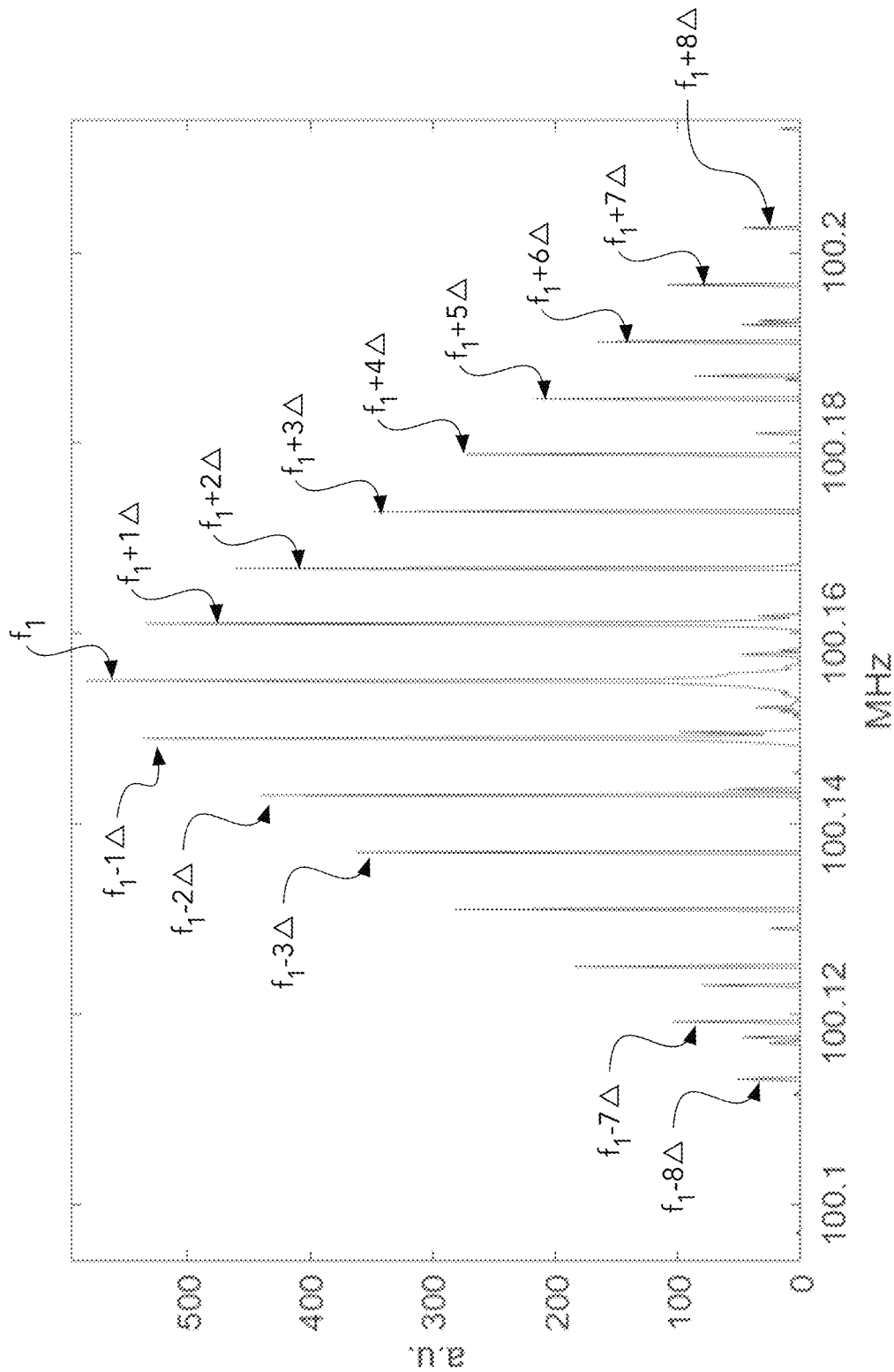
FIG. 5 depicts a frequency comb generated using a quartz resonator.
Figure 6:
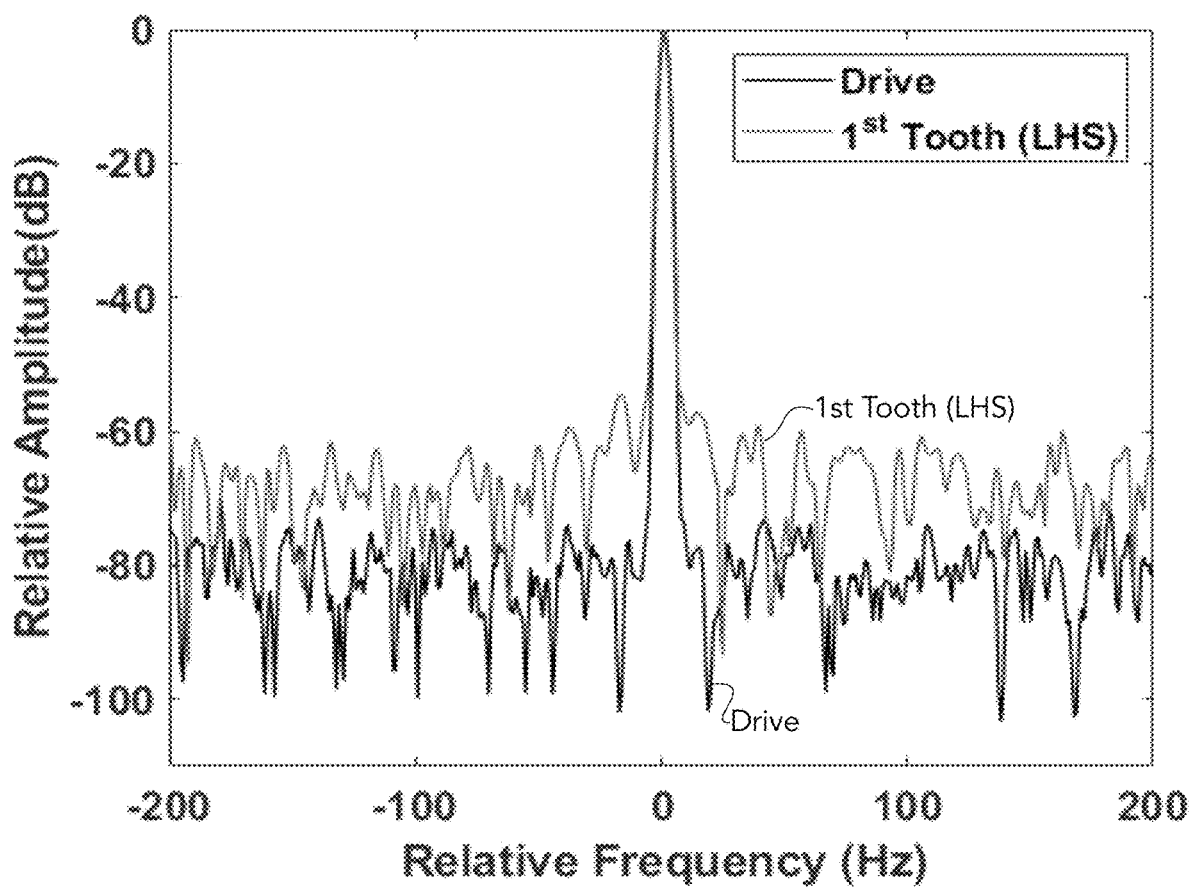
FIG. 6 compares the linewidth of the drive signal to the linewidth of a tooth in the comb.

FIG. 5 depicts a comb which was generated using a quartz resonator with comb frequencies labeled at $f_1 \pm n\Delta$. Note that at the seventh or eight tooth (where n=7 or 8 and thus at frequencies of $f_1 \pm 7\Delta$ or $f_1 \pm 8\Delta$) that the comb signal is sufficiently above the noise level to be useful. With n=7 that means that the differential field being sensed by the resonators 30, 40 in VCXO 1 and NLXO has been increased seven fold. Or if the eighth tooth is examined, then n=8 which means that the differential field being sensed by the resonators 30, 40 in VCXO 1 and NLXO is increased eight fold. Increasing the magnitude of the difference between (i) the Physical field NO sensed by the resonator 30 in VCXO 1 and (ii) the physical field $P_2(t)$ sensed by the resonator 40 in NLXO makes the determination of that difference ($\delta P(t)$) more precise as long as additional or objectionable noise is not introduced by the comb generation. Hence, the detection of the difference ($\delta P(t)$) is improved by using a high fidelity comb generated by the NLXO. When a magnetostrictive material is used with resonators 30, 40, the disclosed gradiometer may be utilized to sense a differential magnetic field.

Figure 8:
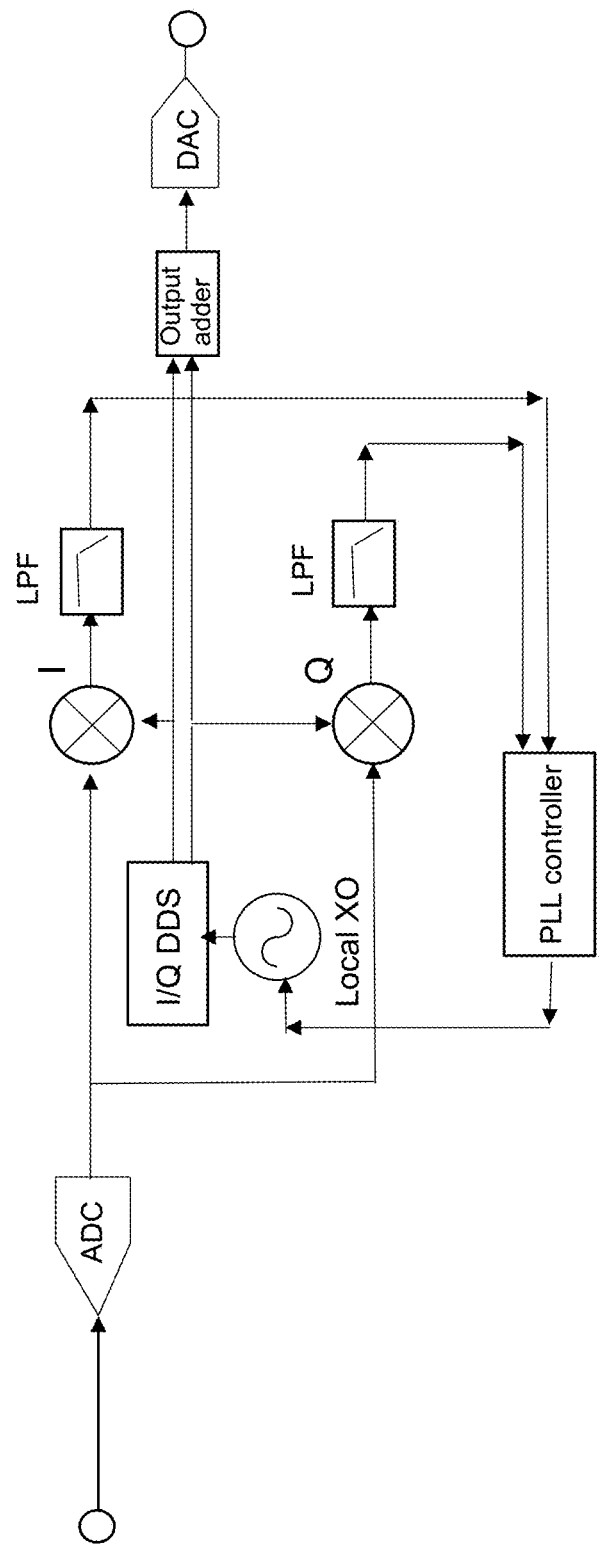
FIG. 8 depicts a digital implementation of a Phase Locked Loop (PLL) circuit.

Turning once again the first and second embodiments of FIGS. 1 and 3, the frequency comb $S_2$ output by NLXO is applied to a phase detection circuit 50 referenced to a second VCXO (VCXO 2). The phase noise of VCXO 2 can be optimized by using a much lower frequency and higher Q resonator than the magnetically sensitive resonators 30, 40 of VCXO 1 and NLXO. In addition, temperature-compensated TCXOs, ovenized OCXO designs, or other frequency references such as small atomic clocks can be used as VCXO 2. By locking the frequency of VCXO 2 to the signal of the $n^{th}$ comb tooth using an analog phase detector (Phased Locked Loop (PLL)) or other digital phase detection techniques such as a digital signal processor (DSP) to implement a digital PPL as shown in FIG. 8, the frequency shift of the comb tooth can be determined more accurately than the original shift $f_1$-$f_2$. Using a third VCXO (VCXO 3 of the second embodiment, see FIG. 3) for subtracting (see subtractor 57) a shift ($\delta f_1$) in the drive frequency from the shift ($\delta f_1+\delta n\Delta$) of the $n^{th}$ tooth of the comb, the relative frequency shift ($\delta n\Delta$) between the drive oscillator and the nonlinear mode frequency can be determined with enhanced sensitivity. Since any measurement phase error can be multiplied by the order (n) of the comb tooth, the accuracy of the frequency difference can be increased by at least n compared to measuring the phase difference between just $f_2$-$f_1$, as performed in an analog or digital Phase Locked Loop or PLL. An example of a digital PLL is shown in FIG. 8. In this technology ADC and DAC are used with direct digital synthesizers and digital phase detectors for implementing the PLL in digital electronics. Digital PLLs can in some cases be noisier than analog circuits but can be implemented with digital logic. See A. Bhatia, et al., "Linearization of Phase Modulated Analog Optical Links using a Four-Wave Mixing Comb Source," Optics Express, DOI: 10.1364/OE 22.030899, Dec. 4, 2014, the disclosure of which is hereby incorporated herein by reference. For optical comb generation, this precise frequency and phase multiplication has been used to increase the accuracy of atomic clocks by several orders of magnitude by sampling multiple sections of the comb and comparing the frequency separations. The bandwidth of the phase detection will be determined by the filter bandwidth within the PLL and this will be limited by the frequency separation between the comb teeth. So producing a comb with large frequency separations and with many teeth is desirable.

Since the frequency difference, $\Delta(t)$, is determined by the changing (over time) magnetic field gradient for magnetic sensing, this method of detection can increase the sensitivity for measuring small gradients in the magnetic field while not necessarily increasing the DC bias of the resonators within the earth's ambient magnetic field.

Figure 7:
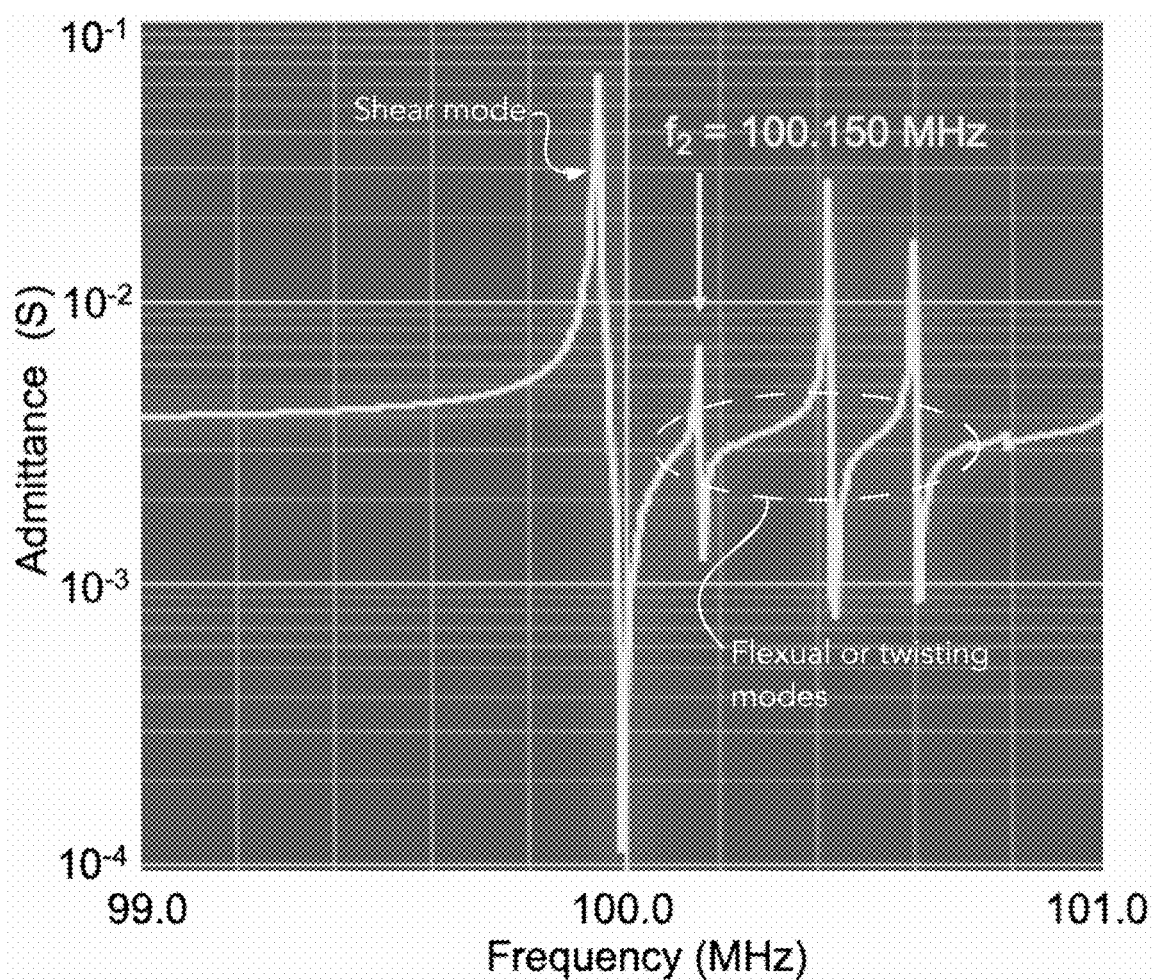
FIG. 7 is a graph of the admittance plot of an embodiment of the resonator used for comb generation.

The number n of comb teeth will be determined by the extent of nonlinearity excited in resonator 40 in the NLXO. FIG. 7 shows the admittance plot of one embodiment of the resonator 40 utilized in the NLXO. For that embodiment, the comb appeared at the 2nd resonance ($f_2$) of a flexural or twisting (non-shear) mode. The 2nd resonance ($f_2$) frequency is approximately equal to the frequency of the $f_1-1\Delta$ comb depicted in FIG. 5. Combs can also be made to appear at shear modes by increasing the power applied to the second resonator 40. It may be possible to increase the nonlinearity and the frequency range over which the nonlinearity exists by using piezoelectric materials other than quartz in resonators 30, 40. In addition, it may be possible to engineer the NLXO to allow mixing of two drive or pump frequency inputs wherein the comb teeth spacings are determined by the frequency differences between the two pump signals. Moreover, this technique can be applied to any set (typically a pair) of resonators which are used to detect the spatial gradient in a physical parameter using frequency shifts of the resonators. Examples are pressure sensors and accelerometers in which the pressure or acceleration gradient creates a difference in the strain on two resonators and thereby produces a relative shift in their resonant frequencies. Typically, the strain is transmitted to a tuning fork end plate for varying the resonant frequency. Thus, pressure or gravity gradiometers could benefit from this technique.

FIGS. 3 and 4 are similar to FIGS. 1 and 2, but differ from them in that in addition to frequency comb $S_2$ output by NLXO being applied to the phase detection circuit 50 referenced to a second VCXO (VCXO 2), the phase detection circuit 50 is coupled with a second phase detection circuit 55 referenced to a third VCXO (VCXO 3) and is coupled with the output $S_1$ of VCXO 1 as mentioned above. The second phase detection circuit 55 serves to cancel (or reduce) any common mode influences in the environmental field or factor to be sensed by resonators 30 and 40 by subtracting the error signal output of the second phase detection circuit 55 from the error signal output of the first phase detection circuit 50.

In the embodiments of FIGS. 1 and 3, the various resonators 30, 40, VXCO 2 and VCXO 3 may have a vibrating member other than quartz, and if a non-crystal vibrating member is used, then the letter 'C' (for 'crystalline') can be omitted from the designations VCXO 1, VCXO 2 and VCXO 3.

The resonators 30, 40 which produce a comb of frequencies are shown to be in close proximity to each other. See the 1 cm dimension on FIG. 2 or the 1.5 cm dimension on FIG. 4. But there is no 'closeness' requirement. There can be further apart and could even exist on separate substrates and be located meters apart. See, for example, the embodiment of FIG. 10. They would, of coarse, have to be electrically connected and the longer the interconnection, the greater the risk of introducing added noise into the measurement. So resonators 30, 40 are desirously kept in close proximity (for example, within 1 cm) to each other unless there is a good reason to space them further apart, such as a desire to increase a Baseline Distance between the two resonators 30, 40 to thereby increase the differential physical field $\delta P(t)$ of respective fields $P_1(t)$ and $P_2(t)$ sensed by resonators 30 and 40.

Figure 9:
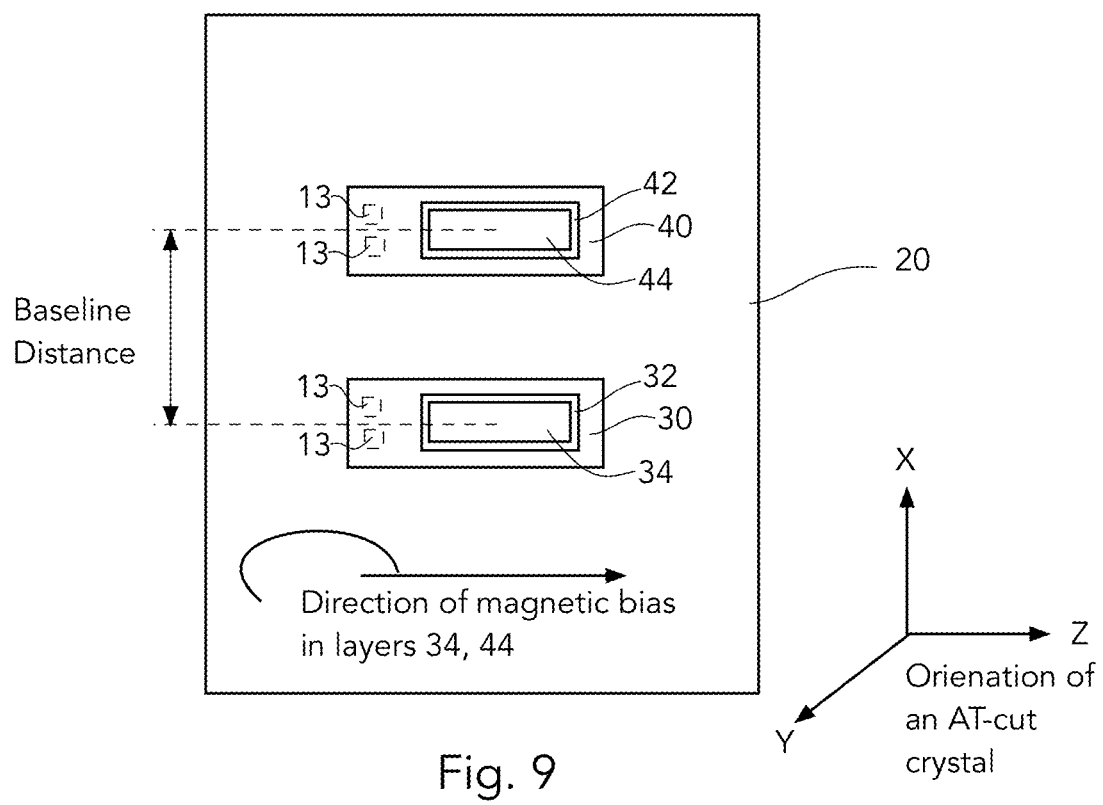
FIG. 9 depicts a top down view of the pair of resonators and circuitry of the embodiment of FIGS. 1 and 2 or the embodiment of FIGS. 3 and 4 being disposed on a substrate of a single IC chip.

FIG. 9 is a top down view of the pair of resonators 30, 40 and circuitry of FIG. 1 disposed on and in a substrate 20 of a single IC chip. Given the technological limits on the sizes of typical IC chips, the Baseline Distance is obviously rather short, which can be desirable in certain embodiments. In this figure, assuming that a differential magnetic field is to be sensed, then the strain inducing layers 34 and 44 are then embodied by a magnetostrictive material as mentioned above. If magnetostrictive material is utilized it is preferably pre-biased in the Z direction to establish a preferred orientation of the magnetic domains. This produces an easy axis and a remanent magnetic moment in the films 33, 34 which are needed for magnetostriction for embodiments used to measure a differential magnetic field.

Figure 10:
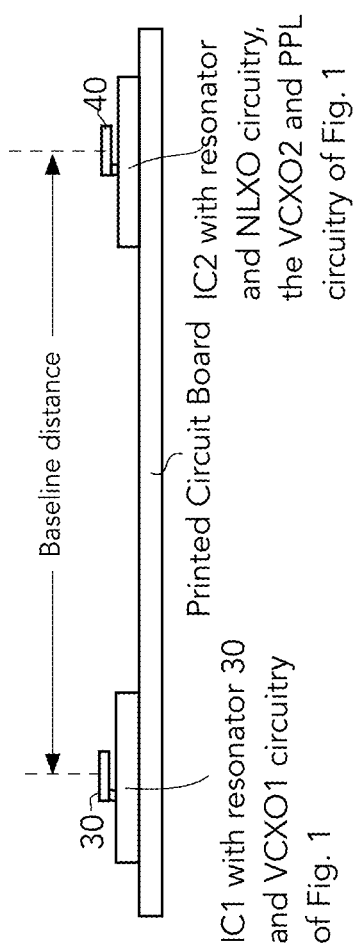
FIG. 10 depicts side elevational view of the resonators and circuitry of the VCXO1 of FIG. 1 or 3 embodied by a first IC chip while the resonator and circuitry of the NLXO of FIG. 1 or 3 is embodied by a second IC chip, the first and second IC chips being disposed on a common printed circuit board substrate, whereby allowing the resonators of to be spaced apart by a further distance than would be reasonable with the single IC chip embodiment of FIG. 9.

If the resonators 30, 40 of the first embodiment (see FIG. 2) or of the second embodiment (see FIG. 4) are desirously spaced apart a greater distance than the embodiments of FIG. 2 or 4 facilitate (to thereby increase the Baseline Distance), that fact may warrant using a printed circuit board as in the embodiment of FIG. 10, then resonator 30 and its associated circuitry of FIG. 1 or 3 are then preferably embodied in a first IC (IC1) while the resonator 40 and its associated circuitry of FIG. 1 or 3 plus the Phase Detector, PLL circuitry and resonator VCXO 2 of FIG. 1 or the two Phase Detectors, PPL circuits, and associated resonators VCXO 2 and VCXO 3 of FIG. 3 are embodied in a second IC (IC2). Each of those ICs (IC1 and IC2) are preferably encapsulated with an optional capping wafer (similar to the capping wafer shown in of FIG. 2 or 4, for example) and then each IC (IC1 and IC2) is then preferably disposed on a common substrate (a printed circuit board with metallic traces to interconnect the circuits shown, for example, by FIG. 1 or 3).

Figure 11:
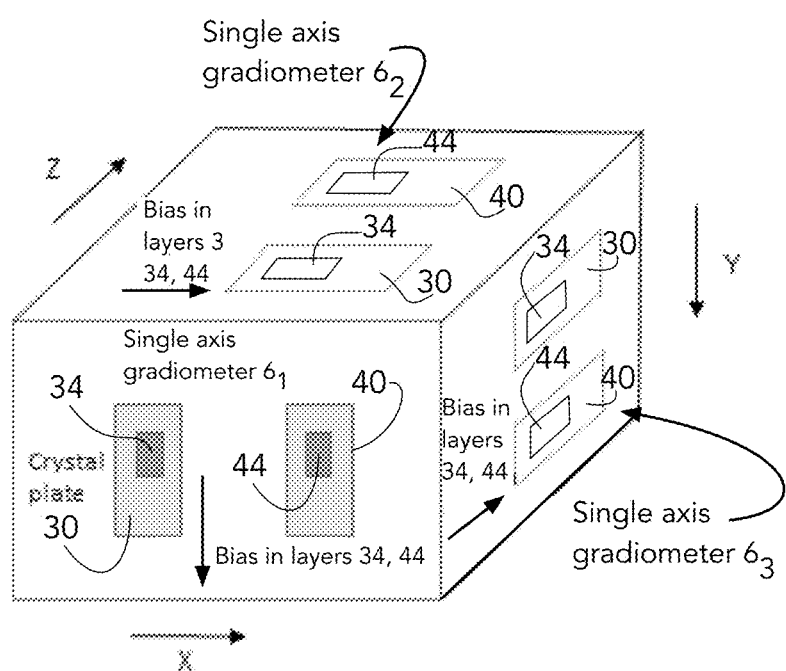
FIG. 11 depicts an embodiment of a three axis MEMS vector magnetic gradiometer.

The pair of resonators 30, 40 with the circuitry of the embodiment of FIG. 1 or the embodiment of FIG. 3 form a single axis MEMS magnetic field gradiometer 10 when a magnetostrictive material is utilized for elements 34 and 44. In FIG. 11, a 3D embodiment having three single axis MEMS gradiometers $6_1$, $6_2$ and $6_3$ form a three-axes vector magnetic gradiometer by mounting a set of three resonator pairs $6_1$, $6_2$, $6_3$ on the sides of a cube so that the major plane of each pair of resonators 30, 40 is disposed at a right angle to the other two pairs of resonators 30, 40. For each pair of resonators (for example, the pair of resonator 30, 40 shown in FIG. 1, 2, 3, 4 or 9), the magnetostrictive material 34, 44 on the resonators 30, 40 should be magnetically biased (with a remanent magnetic moment and easy axis) in the crystal (preferably quartz) Z direction (see FIG. 9) for maximum sensitivity. Based on previous reported data (see Y. Hui, et al., "High Resolution Magnetoelectric MEMS-CMOS Oscillator," *J. of Micromechanical Systems*, Vol. 24, No. 1, February 2015, pp. 134-143, the disclosure of which is hereby incorporated herein by reference), the sensitivity in the direction of the easy axis in the resonator plane will be near zero while the sensitivity in the in-plane direction normal to the easy axis (X direction of FIG. 9) will be maximum. Since producing a perpendicular remanent magnetization is very difficult for material without a grain structure supporting a perpendicular magnetic anisotropy, the sensitivity should be near zero in the out-of-major-plane direction as well. A three dimensional vector gradiometer is provided with the embodiment of FIG. 11.

The strain inducing layers 34 and 44 are preferably embodied by a magnetostrictive material disposed on the resonators 30, 40 when the disclosed gradiometer 10 is intended to sense a differential magnetic field. The magnetostrictive material may be a ferromagnetic material which exhibits a magnetostrictive (or magneto-elastic) response, such as Ni, Terfenol-D, FeGa, FeGaB, MnZn Ferrite, FeCoB, Alfenol, and/or certain MetGlas® alloys. There are other magnetostrictive materials than those identified above which may be utilized or which may be developed in the future as magnetostrictive materials. It is to be understood that the discovery of new materials which are highly magnetostrictive (also called magnetoelastic in the art) is ongoing. In this disclosure the term magnetostrictive material(s) or magnetostrictive layer or magnetostrictive material film is intended to refer to magnetic materials whose magnetostrictive piezomagnetic coefficient is roughly equal to or greater than 1 ppm/Oe. Moreover, amorphous magnetostrictive materials such as FeGa, FeGaB, and FeCoB are currently preferred as the magnetostrictive material film used on the resonators due to relative ease of manufacture.

The pairs of resonators 30, 40 may be VHF or UHF type quartz resonator and they should preferably be identical to each other (preferably within 10 parts in a million).

Attached hereto as Appendix A is paper entitled "Phononic Comb Generation in High-Q Quartz Resonators", by R. L. Kubena, W. S. Wall, J. Koehl, and R. J. Joyce of HRL Laboratories, LLC, Malibu, Calif., Appl. Phys. Lett. 116, 053501 (2020), which is hereby incorporated herein by reference.

The resonators 30, 40 are preferably formed of AT-cut quartz. A quartz material is desirable due to its high Q and low temperature sensitivity, but, as is mentioned above, other piezo-electric materials may be used as the vibrating member in these resonators if desired.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A differential gradiometer comprising a substrate with at least a pair of resonators disposed thereon, wherein each of the at least a pair of resonators is at least partially covered or coated or coupled with a strain inducing structure, material or film, a first one of said pair of resonators being connected with a circuit for forming a first oscillator, the second one of said pair of resonators being connected with another circuit for forming a non-linear oscillator, an output of the first oscillator being applied to the non-linear oscillator for generating a comb of frequencies, wherein a difference between adjacent teeth in the comb of frequencies correspond to a difference in strains sensed by the at least the pair of resonators of the first oscillator and the non-linear oscillator.

2. A differential gradiometer of claim 1 in which a sensitivity of the gradiometer is enhanced by detecting a frequency shift of an nth tooth of the comb of frequencies.

3. A differential gradiometer of claim 2 in which the sensitivity of the gradiometer is enhanced by a factor of n by detecting the frequency shift of the nth tooth of the comb of frequencies.

4. A differential gradiometer of claim 1 in which the at least a pair of resonators are integrated to the substrate using a metal alloy bond.

5. A differential gradiometer of claim 1 in which the at least a pair of resonators each comprise a piezoelectric quartz material.

6. A differential gradiometer of claim 3 wherein the piezoelectric quartz material is a temperature-compensated cut of crystalline quartz.

7. A differential gradiometer of claim 3 wherein the piezoelectric quartz material is an AT-cut crystalline quartz.

8. A differential gradiometer of claim 1 in which the substrate comprises a semiconductor material with the pair of resonators being bonded thereto.

9. A differential gradiometer of claim 1 in which the first one of the at least a pair of resonators is connected to electronics forming a sustaining circuit comprising said first oscillator and wherein the circuitry forming the non-linear oscillator comprises at least an automatic gain control circuit.

10. A differential gradiometer of claim 9 in which the sustaining circuit and the automatic gain control circuit are located in or are attached to the substrate.

11. A differential gradiometer of claim 1 wherein the gradiometer is sensitive to a differential magnetic field and wherein the strain inducing material is a magnetostrictive material or film.

12. A differential gradiometer of claim 11 wherein the magnetostrictive material or film is a ferromagnetic material selected from the group consisting of Ni, Terfenol-D, Alfenol, FeGa, FeGaB and FeCoB.

13. A differential gradiometer of claim 11 in which the magnetostrictive film consists of an amorphous ferromagnetic material having a magnetostrictive piezomagnetic coefficient of at least 1 ppm/Oe.

14. A differential gradiometer of claim 9 further including an additional oscillator coupled with a mixer and phase detector, the mixer being coupled with an output of the non-linear oscillator.

15. A differential gradiometer of claim 9 in which the sustaining circuit for the first oscillator is configured to operate as a voltage controlled crystal oscillator.

16. A differential gradiometer of claim 15 in which the output of the voltage controlled crystal oscillator is used as an input to the non-linear oscillator.

17. A differential gradiometer of claim 14 in which an output of the non-linear oscillator used as an input to a phase locked loop comprising said additional oscillator coupled with said mixer and phase detector for locking the additional oscillator to a selected one of the frequencies in said comb of frequencies.

18. A differential gradiometer of claim 17 in which the additional oscillator is locked to the nth tooth of the comb thereby increasing the sensitivity of the gradiometer by a factor of n.

19. A differential gradiometer of claim 17 in which an error signal generated by the phase locked loop corresponds to a difference in the magnetic fields by sensed by the at least the pair of resonators of the first oscillator and the non-linear oscillator.

20. A differential gradiometer of claim 17 in which phase locked loop electronics and the non-linear oscillator and other oscillator circuits are located in or on said substrate.

21. A differential gradiometer of claim 1 wherein the resonator of the second one of said pair of resonators, in use, is driven at a second, or higher, resonant mode.

22. A differential gradiometer of claim 1 in which the first one of the at least a pair of resonators and the second one of the at least a pair of resonators are hermetically sealed.

23. A differential gradiometer of claim 11 wherein said resonators include metallic electrodes coupled to said first and second mentioned circuits and wherein at least one metallic electrode of each said resonators is at least partially covered or coated with said magnetostrictive material or film.

24. A method of improving or enhancing an environmental factor (such as a magnetic field, a field of temperatures, a gravity gradient, etc), the environmental factor being sensed with the aid of a first resonator configured as an oscillator, applying an output of the first oscillator to a second resonator configured in a circuit as a non-linear resonator for generating a comb of frequencies, the frequencies in said comb of frequencies being each separated by a frequency that corresponds to a difference in said environmental factor as sensed at the first and second resonators, and applying an output of the non-linear resonator to a mixer, phase detector and a second oscillator for selecting a $n^{th}$ one of the frequencies in said comb of frequencies for detecting an n times enhanced version of said difference in said environmental factor as sensed at the first and second resonators.

25. An apparatus for sensing an environmental factor (such as a magnetic field, a field of temperatures, a gravity gradient, etc), the environmental factor being sensed with the aid of a first resonator configured as an oscillator, an output of the first oscillator is coupled to a second resonator configured in a circuit as a non-linear resonator for generating a comb of frequencies, the frequencies in said comb of frequencies being each separated by a frequency that corresponds to a difference in said environmental factor as sensed at the first and second resonators, the non-linear resonator having an output coupled to a mixer, phase detector and a second oscillator for (i) selecting a $n^{th}$ one of the frequencies in said comb of frequencies and (ii) detecting an n-times enhanced version of said difference in said environmental factor as sensed at the first and second resonators.

* * * * *